United States Patent
Wang et al.

(10) Patent No.: US 12,402,495 B2
(45) Date of Patent: Aug. 26, 2025

(54) DISPLAY APPARATUS HAVING FLEXIBLE PANEL AND SHIELDED MULTIPLEXER IN NON-DISPLAY SUB-REGION AND METHOD FOR MANUFACTURING THE SAME

(71) Applicants: Chengdu BOE Optoelectronics Technology Co., Ltd., Sichuan (CN); BOE Technology Group Co., Ltd., Beijing (CN)

(72) Inventors: Yu Wang, Beijing (CN); Linhong Han, Beijing (CN); Tingliang Liu, Beijing (CN); Yi Zhang, Beijing (CN); Huijuan Yang, Beijing (CN); Tinghua Shang, Beijing (CN); Yang Zhou, Beijing (CN); Pengfei Yu, Beijing (CN); Shun Zhang, Beijing (CN); Hao Zhang, Beijing (CN); Xiaofeng Jiang, Beijing (CN); Huijun Li, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 91 days.

(21) Appl. No.: 17/438,395

(22) PCT Filed: Feb. 9, 2021

(86) PCT No.: PCT/CN2021/076178
§ 371 (c)(1),
(2) Date: Sep. 10, 2021

(87) PCT Pub. No.: WO2021/164639
PCT Pub. Date: Aug. 26, 2021

(65) Prior Publication Data
US 2022/0384557 A1  Dec. 1, 2022

(30) Foreign Application Priority Data
Feb. 19, 2020  (CN) .......................... 202010102912.5

(51) Int. Cl.
*H10K 59/126* (2023.01)
*H10K 59/131* (2023.01)
(Continued)

(52) U.S. Cl.
CPC ......... *H10K 59/126* (2023.02); *H10K 59/131* (2023.02); *H10K 59/1201* (2023.02); *H10K 71/00* (2023.02); *H10K 2102/311* (2023.02)

(58) Field of Classification Search
CPC .. H10K 59/131; H10K 71/00; H10K 59/1201; H10K 2102/311; H10K 59/126;
(Continued)

(56) References Cited

U.S. PATENT DOCUMENTS

| | | | | |
|---|---|---|---|---|
| 2013/0016065 A1* | 1/2013 | Reynolds | ............. | H05K 1/0306 345/174 |
| 2015/0294987 A1* | 10/2015 | Xia | ........................ | H01L 23/552 257/659 |

(Continued)

FOREIGN PATENT DOCUMENTS

| CN | 103926732 A | 7/2014 |
|---|---|---|
| CN | 109326628 A | 2/2019 |

(Continued)

OTHER PUBLICATIONS

Translation of JP-2019215726-A (Year: 2019).*
(Continued)

*Primary Examiner* — Davienne N Monbleau
*Assistant Examiner* — John Patrick Cornely
(74) *Attorney, Agent, or Firm* — IPro, PLLC (57) ABSTRACT

A display apparatus and a method for manufacturing the display apparatus are provided. The display apparatus
(Continued)

includes: a flexible panel which includes a display region and a non-display region, where the non-display region includes a bending sub-region and a back sub-region connected to the bending sub-region and arranged opposite to the display region, a multiplexer is arranged in the back sub-region; and a shielding electrode layer located on a side of the multiplexer away from the back sub-region, an orthographic projection of the multiplexer onto a plane where the shielding electrode layer is located being within the shielding electrode layer.

6 Claims, 4 Drawing Sheets

(51) Int. Cl.
*H10K 59/12* (2023.01)
*H10K 71/00* (2023.01)
*H10K 102/00* (2023.01)

(58) Field of Classification Search
CPC .... H04M 1/0268; H04M 1/0269; H01Q 1/22; H01Q 1/526; H01Q 1/2283; H01L 23/552; H01L 23/66; H01L 2223/6677
See application file for complete search history.

(56) References Cited

U.S. PATENT DOCUMENTS

| | | |
|---|---|---|
| 2015/0382446 A1* | 12/2015 | Kwon ................... G06F 1/1643 174/251 |
| 2018/0183910 A1* | 6/2018 | Wu .......................... H04B 5/26 |
| 2019/0033493 A1 | 1/2019 | Kwon et al. |
| 2020/0403597 A1* | 12/2020 | Takeuchi ............... H03H 7/463 |
| 2021/0181888 A1 | 6/2021 | Yan et al. |
| 2021/0192987 A1 | 6/2021 | Du et al. |
| 2021/0225982 A1 | 7/2021 | Yi |
| 2022/0164002 A1* | 5/2022 | An ........................ G06F 1/1652 |

FOREIGN PATENT DOCUMENTS

| | | |
|---|---|---|
| CN | 110187797 A | 8/2019 |
| CN | 110570772 A | 12/2019 |
| CN | 110992834 A | 4/2020 |
| CN | 111312765 A | 6/2020 |
| JP | 2019215726 A * | 12/2019 |
| KR | 20140108827 A | 9/2014 |

OTHER PUBLICATIONS

CN 2020101029125 first office action.
PCT/CN2021/076178 international search report and written opinion.

* cited by examiner

Fig. 5 forming the flexible panel 100, and forming the display region 110 and the non-display region 120 on the flexible panel 100, where the non-display region includes the bending sub-region and the back sub-region connected to the bending sub-region and arranged opposite to the display region — S610 mounting the MUX 200 in the back sub-region 122 of the non-display region 120 — S620 forming the shielding electrode layer 300 at the side of the MUX 200 away from the back sub-region 122, where the orthographic projection of the MUX 200 onto the plane where the shielding electrode layer 300 is located is within the shielding electrode layer 300 — S630

DISPLAY APPARATUS HAVING FLEXIBLE PANEL AND SHIELDED MULTIPLEXER IN NON-DISPLAY SUB-REGION AND METHOD FOR MANUFACTURING THE SAME

CROSS-REFERENCE TO RELATED APPLICATIONS

The present application claims a priority to Chinese Patent Application No. 202010102912.5 filed in China on Feb. 19, 2020, which is incorporated herein by reference in its entirety.

TECHNICAL FIELD

The present disclosure relates to the field of display technology, in particular to a display apparatus and a method for manufacturing the display apparatus.

BACKGROUND

An active-matrix organic light-emitting diode (AMOLED) display technology has developed rapidly, has a broad application prospect, and has been widely applied in mobile products.

SUMMARY

The present disclosure provides a display apparatus, including: a flexible panel, where the flexible panel includes a display region and a non-display region, the non-display region includes a bending sub-region and a back sub-region connected to the bending sub-region and arranged opposite to the display region, and a multiplexer is arranged in the back sub-region; and a shielding electrode layer located on a side of the multiplexer away from the back sub-region, an orthographic projection of the multiplexer onto a plane where the shielding electrode layer is located being within the shielding electrode layer.

Optionally, the display apparatus further includes a power supply line located on the side of the multiplexer away from the back sub-region and connected to the shielding electrode layer.

Optionally, a plurality of display signal lines is further arranged in the back sub-region, and at least one display signal line is further used as the power supply line.

Optionally, a voltage inputted into the display signal line is a direct-current voltage.

Optionally, the display signal line includes a VDD signal line further used as the power supply line.

Optionally, a first insulation layer is provided between the shielding electrode layer and the VDD signal line, and the shielding electrode layer is connected to the VDD signal line through a first via-hole penetrating the first insulation layer.

Optionally, the display signal line includes a VSS signal line further used as the power supply line.

Optionally, a second insulation layer is provided between the shielding electrode layer and the VSS signal line, and the shielding electrode layer is connected to the VSS signal line through a second via-hole penetrating the second insulation layer.

Optionally, the display signal line includes a VGH signal line further used as the power supply line.

Optionally, a third insulation layer is provided between the shielding electrode layer and the VGH signal line, and the shielding electrode layer is connected to the VGH signal line through a third via-hole penetrating the third insulation layer.

Optionally, the display signal line includes a VGL signal line further used as the power supply line.

Optionally, a fourth insulation layer is provided between the shielding electrode layer and the VGL signal line, and the shielding electrode layer is connected to the VGL signal line through a fourth via-hole penetrating the fourth insulation layer.

Optionally, the display apparatus further includes: a chip on film arranged in the back sub-region, where a ground line is provided on the chip on film, and the ground line is further used as the power supply line.

Optionally, the shielding electrode layer is connected to the ground line through a connection line.

Optionally, the display apparatus further includes a bearing structure arranged opposite to the flexible panel and an antenna unit located on the bearing structure, and both the bearing structure and the antenna unit are arranged on one side of the shielding electrode layer away from the back sub-region.

Optionally, an orthographic projection of the antenna unit onto the plane where the shielding electrode layer is located is within the shielding electrode layer.

Optionally, the display region of the flexible panel includes a plurality of organic light-emitting diode (OLED) display units.

The present disclosure further provides a method for manufacturing the above-mentioned display apparatus, including: forming the flexible panel, and forming the display region and the non-display region on the flexible panel, where the non-display region includes the bending sub-region and the back sub-region connected to the bending sub-region and arranged opposite to the display region; mounting the multiplexer in the back sub-region; and forming the shielding electrode layer at the side of the multiplexer away from the back sub-region, where the orthographic projection of the multiplexer onto the plane where the shielding electrode layer is located is within the shielding electrode layer.

Optionally, when the ground line provided on the chip on film is further used as a power supply line for applying a stable voltage to the shielding electrode layer, the method further includes: after the shielding electrode layer is formed, arranging a connection line between the shielding electrode layer and the ground line of the chip on film, to connect the shielding electrode layer to the power supply line.

Optionally, the flexible panel includes a base substrate and an insulation layer on the base substrate, a plurality of display signal lines is further arranged in the back sub-region, and when at least one display signal line is further used as the power supply line, the forming the shielding electrode layer on the side of the multiplexer away from the back sub-region includes: forming a via-hole penetrating the insulation layer at a position, corresponding to the display signal line, on the insulation layer, away from the base substrate, in the back sub-region; and depositing a conductive material on the insulation layer provided with the via-hole to form the shielding electrode layer, where the shielding electrode layer is connected to the display signal line through the via-hole.

DETAILED DESCRIPTION

In order to make the technical problems to be solved, technical solutions and advantages of the present disclosure more apparent, a detailed description will be given below with reference to the accompanying drawings and specific embodiments.

In an AMOLED display apparatus, in order to save a space occupied by a driving part, improve a screen-to-body ratio and achieve a full screen display effect, it is necessary to bend a part of a driving region of a display panel to a back side of the display panel during an assembly, and a driving member is arranged in the driving region bent to the back side of the display panel. In the AMOLED display apparatus of the related art, the driving member includes a multiplexer (MUX) for applying a voltage control signal to the display panel.

A voltage signal inputted into the MUX alternates between a high voltage and a low voltage, and the alternating voltage signal may form electromagnetic radiation. A circuit board is arranged inside the display apparatus and opposite to the display panel, and an overall antenna is arranged in the circuit board. The electromagnetic radiation generated by the MUX may generate electromagnetic interference to the overall antenna, so as to affect a usage effect of the overall antenna.

In order to solve the problem that, in the display apparatus of the related art, the electromagnetic interference is caused when a part of the driving region of the display panel is bent to the back side of the display panel, and the alternating voltage signal of the MUX arranged in the driving region generates electromagnetic radiation. The embodiments of the present disclosure provide a display apparatus, a non-display region on a flexible panel of the display apparatus includes a back sub-region bent to the back side of the display region, a multiplexer (MUX) is arranged in the back sub-region, and a shielding electrode layer is arranged in the back sub-region, and covers the MUX, so as to shield the electromagnetic interference generated by the MUX.

Figure 1:
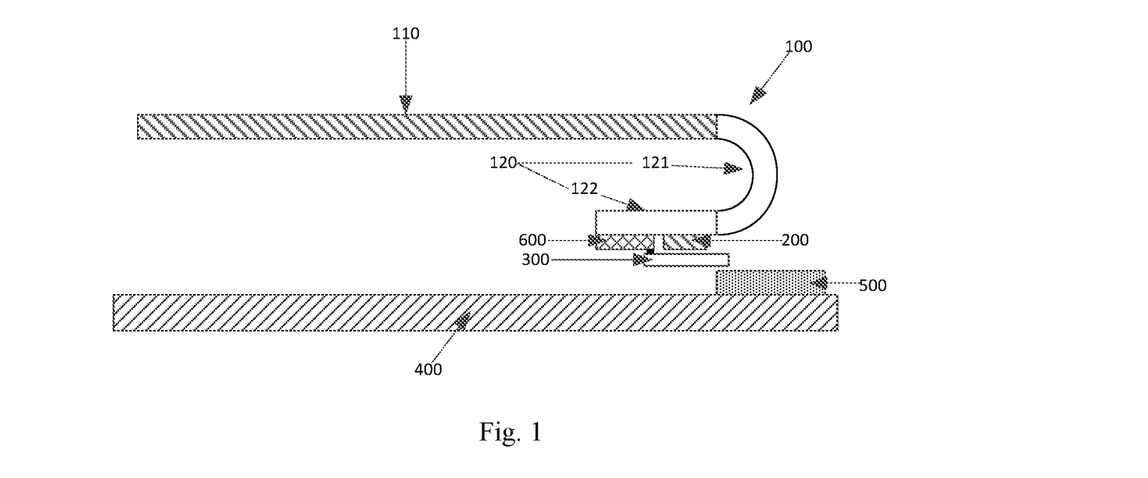
FIG. 1 is a sectional view of a display apparatus according to an embodiment of the present disclosure.
Figure 2:
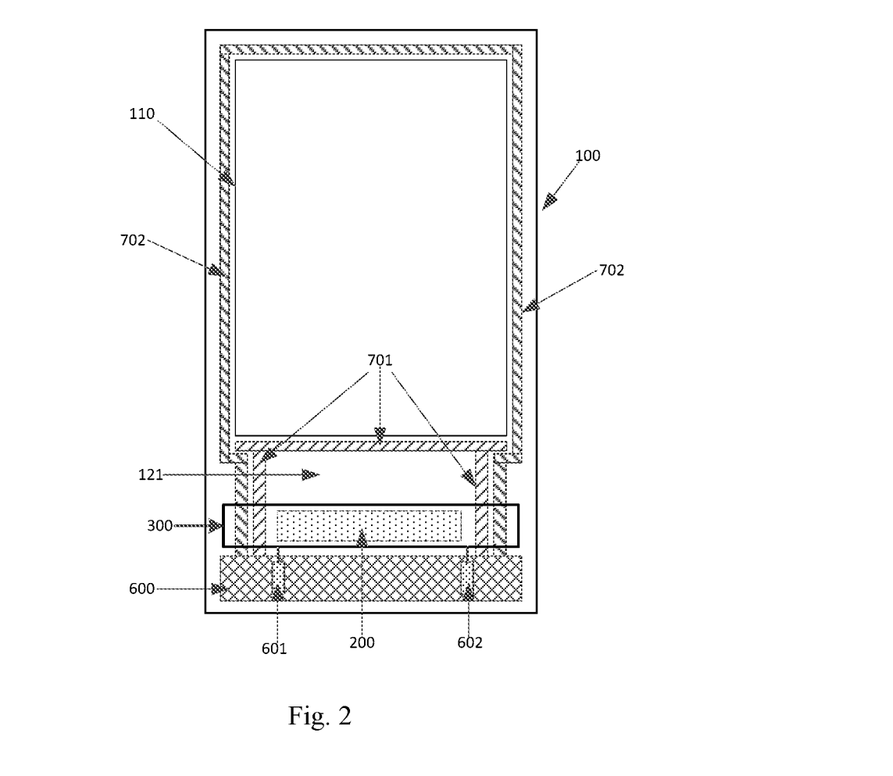
FIG. 2 is a planer view of the display apparatus according to an embodiment of the present disclosure.

The display apparatus according to an embodiment of the present disclosure, as shown in FIGS. 1 and 2, includes: a flexible panel 100, where the flexible panel 100 includes a display region 110 and a non-display region 120, the non-display region 120 includes a bending sub-region 121 and a back sub-region 122 connected to the bending sub-region 121 and arranged opposite to the display region 110, and a multiplexer MUX 200 arranged in the back sub-region 122; and a shielding electrode layer 300 located on a side of the MUX 200 away from the back sub-region 122, an orthographic projection of the MUX 200 onto a plane where the shielding electrode layer 300 is located being within the shielding electrode layer 300.

In some embodiments, the display apparatus further includes a power supply line located on the side of the MUX 200 away from the back sub-region 122 and connected to the shielding electrode layer 300.

In the embodiment of the present disclosure, the power supply line is connected to the shielding electrode layer 300 and used to apply a voltage to the shielding electrode layer 300, so that the shielding electrode layer 300 has a stable potential. Since the shielding electrode layer 300 is arranged on the side of the MUX 200 away from the back sub-region 122, and the orthographic projection of the MUX 200 onto the plane where the shielding electrode layer 300 is located is within the shielding electrode layer 300, the shielding electrode layer 300 covers the MUX 200 on the side of the MUX 200 away from the back sub-region 122, and the shielding electrode layer 300 having a stable potential absorbs and reflects the electromagnetic interference generated by the MUX 200. Thus, the electromagnetic interference generated by the MUX 200 is confined to a side of the shielding electrode layer 300 toward the MUX 200, and prevented from diffusing to a side of the shielding electrode layer 300 away from the MUX 200.

In one embodiment of the present disclosure, as shown in FIG. 1, the display apparatus further includes a bearing structure 400 arranged opposite to the flexible panel 100 and an antenna unit 500 on the bearing structure 400; and both the bearing structure 400 and the antenna unit 500 are arranged on one side of the shielding electrode layer 300 away from the back sub-region 122.

In the embodiment of the present disclosure, since the shielding electrode layer 300 is located between the MUX 200 and the antenna unit 500, the electromagnetic interference generated by the MUX 200 may be prevented from diffusing to the antenna unit 500 by using the shielding electrode layer 300. Therefore, in the display apparatus according to the embodiment of the present disclosure, it is able to solve the problem that the alternating voltage signal of the MUX generates electromagnetic radiation and causes electromagnetic interference to the antenna.

In the embodiment of the present disclosure, optionally, an orthographic projection of the antenna unit 500 onto the plane where the shielding electrode layer 300 is located is within the shielding electrode layer 300.

Based on this arrangement, the electromagnetic interference caused to the antenna by electromagnetic radiation generated from the alternating voltage signal of the MUX 200 can be effectively avoided by the shielding electrode layer 300.

Optionally, the bearing structure 400 for bearing the antenna unit 500 may be a flexible circuit board, or may be a support frame or the like specifically for fixing the antenna unit 500.

In the display apparatus according to an embodiment of the present disclosure, a display function device is formed on the flexible panel 100 for realizing a display function, and a region where the display function device is located on the flexible panel 100 is correspondingly formed as the display region 110. On the flexible panel 100, a region where the display functional device is not provided is the non-display region 120, and a driving assembly and a chip on film 600 are arranged in the non-display region 120 located at one end of the display region 110. The chip on film 600 is used to connect the driving assembly to the flexible circuit board for applying a driving control signal to the driving component.

In addition, there is a spacing region between the driving assembly and the display region 110, and the bending sub-region 121 is located in the spacing region.

As shown in FIG. 1, the non-display region 120 is bent in a direction opposite to the display region 110 through the bending sub-region 121, so that the driving assembly and the chip on film 600 are bent to the back side opposite to the display region 110. That is, a portion, opposite to the display region 110, of the non-display region 120 forms the back sub-region 122, and the driving assembly and the chip on film 600 are located in the back sub-region 122.

In the embodiment of the present disclosure, optionally, the display functional device in the display region 110 of the flexible panel 100 includes a plurality of organic light-emitting diode (OLED) display units.

Further, optionally, the driving assembly in the back sub-region 122 includes the MUX 200.

Figure 7:
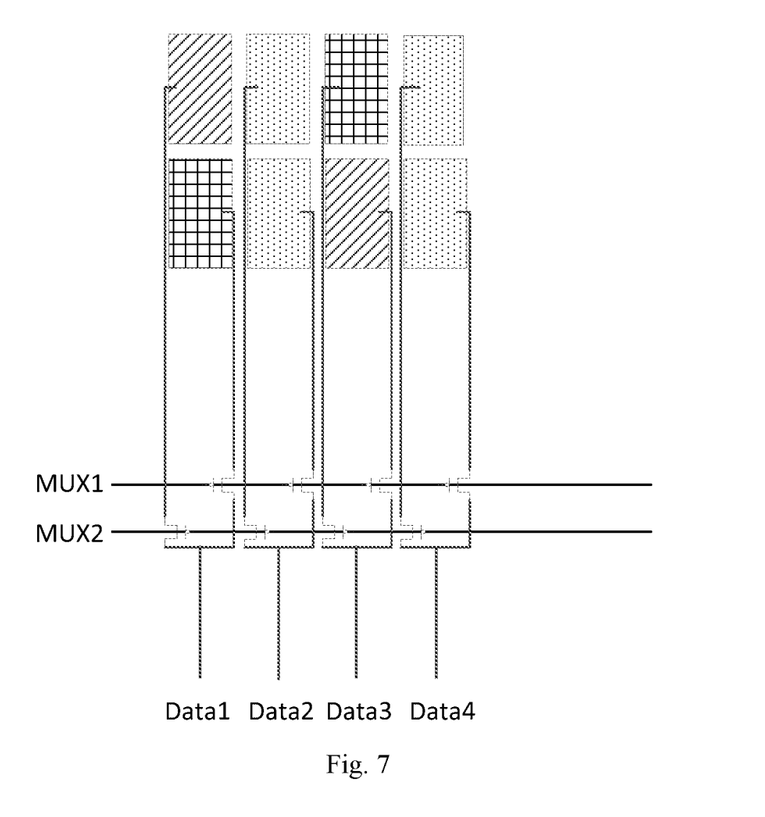
FIG. 7 is a schematic diagram of an operation principle of an MUX according to an embodiment of the present disclosure.

Optionally, in the embodiment of the present disclosure, as shown in FIG. 7, the MUX 200 may be used for the data signal distribution in the display panel. A data signal outputted by a display driving chip of the display apparatus is distributed through the MUX 200 and then inputted into the display region of the display panel, so as to reduce the number of lines for inputting the data signal and reduce a frame space and a rounded-corner space in the non-display region.

Optionally, the MUX 200 includes a plurality of MUX units, each MUX unit includes 2 or more thin film transistors TFT. In a case that each MUX unit includes two TFTs, source electrodes of the two TFTs are connected to a same data signal line inputted by the display driving chip, and drain electrodes are connected to the display region through two columns of different data signal lines. Each TFT is turned on or off through an inputted gate signal, so as to achieve the signal distribution.

Based on the MUX 200 having the above structure, in each MUX unit, the gate signal is at a low level when the TFT is in an on state and at a high level when the TFT is in an off state, and within one frame, the gate signal is switched between the high level and the low level according to a certain frequency. A change in potential may be referred to as a change in current and charge, and a time-varying current may generate electromagnetic radiation, so as to cause the problem of the electromagnetic interference generated by the MUX 200.

In addition, in the display apparatus according to the embodiment of the present disclosure, in one embodiment, a ground line is provided on the chip on film 600, and the ground line is further used as the power supply line for applying a stable voltage to the shielding electrode layer 300.

As shown in FIG. 2, the shielding electrode layer 300 is connected to the ground line through a connection line. Optionally, the shielding electrode layer 300 is connected to a ground terminal 601, 602 of the chip on film 600 through the connection line.

In the embodiment, when the shielding electrode layer 300 is connected to the ground line on the chip on film 600, so that the electromagnetic interference generated by the MUX 200 is prevented from diffusing to the side of the shielding electrode layer 300 away from the MUX 200, and is grounded.

Figure 3:
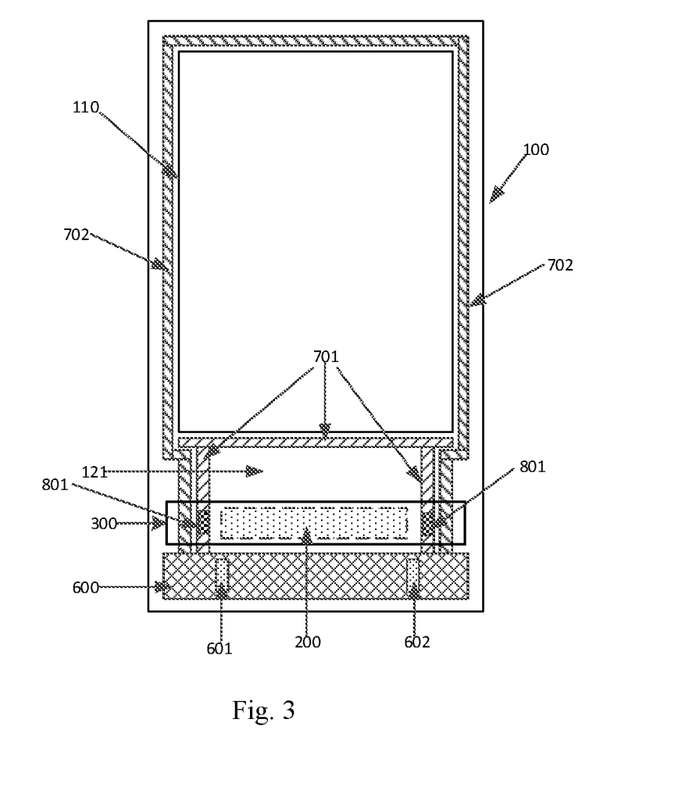
FIG. 3 is another planer view of the display apparatus according to an embodiment of the present disclosure.
Figure 4:
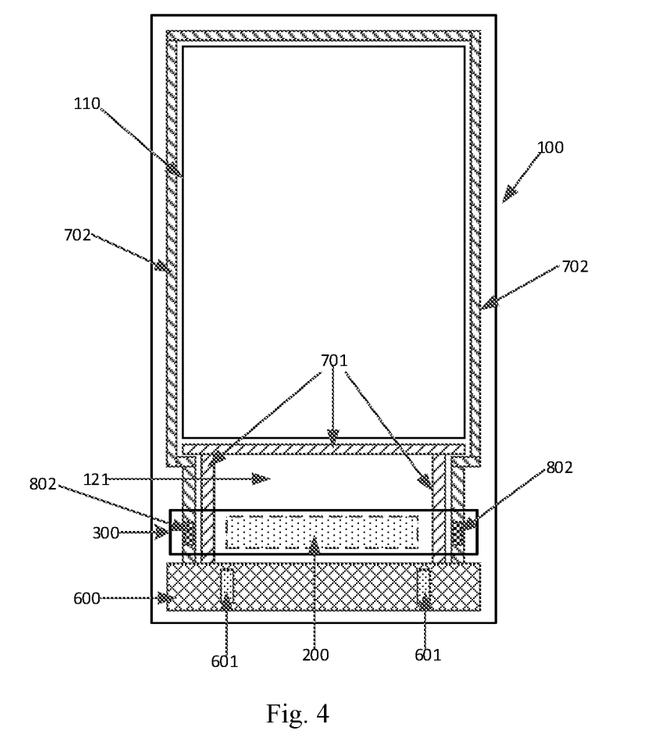
FIG. 4 is yet another planer view of the display apparatus according to an embodiment of the present disclosure.

In the display apparatus according to an embodiment of the present disclosure, as shown in FIGS. 3 and 4, on the flexible panel, display signal line for inputting a display control signal to the display function device of the display region 110 is further arranged in the non-display region 120.

The display signal line includes a VDD signal line 701 and a VSS signal line 702, the VDD signal line 701 includes a first portion arranged along an edge, close to the chip on film 600, of the display region 110, and a second portion between the chip on film 600 and the display region 110, and used to connect the first portion to the chip on film 600. The VSS signal line 702 includes a third portion surrounding edges of the display region 110, and a fourth portion between the chip on film 600 and the display region 110 and used to connect the third portion to the chip on film 600.

In some embodiments, a voltage inputted into the display signal line is a direct-current voltage.

In the display apparatus of the present disclosure, the VDD signal line 701 may be further used as the power supply line for applying a stable voltage to the shielding electrode layer 300, as shown in FIG. 3.

In another embodiment, the VSS signal line 702 may be further used as the power supply line for applying a stable voltage to the shielding electrode layer 300, as shown in FIG. 4.

In the embodiment, the VDD signal line 701 or the VSS signal line 702 is further used as the power supply line for applying the stable voltage to the shielding electrode layer 300, so that the shielding electrode layer 300 connected to the VDD signal line 701 or the VSS signal line 702 has a stable potential and the electromagnetic interference generated by the MUX 200 may be prevented from diffusing to the side of the shielding electrode layer 300 away from the MUX 200.

Optionally, when the VDD signal line 701 or the VSS signal line 702 is further used as the power supply line for applying the stable voltage to the shielding electrode layer 300, an insulation layer (i.e., a first insulation layer or a second insulation layer) is provided between the VDD signal line 701 or the VSS signal line 702 and the shielding electrode layer 300. The shield electrode layer 300 is connected to the VDD signal line 701 or the VSS signal line 702 through a via-hole penetrating the insulation layer.

As shown in FIG. 3, when the VDD signal line 701 is further used as the power supply line for applying the stable voltage to the shielding electrode layer 300, the shielding electrode layer 300 is connected to the second portion of the VDD signal line 701 between the chip on film 600 and the display region 110 through a first via-hole 801 penetrating the first insulation layer.

As shown in FIG. 4, when the VSS signal line 702 is further used as the power supply line for applying the stable voltage to the shielding electrode layer 300, the shielding electrode layer 300 is connected to the fourth portion of the VSS signal line 702 between the chip on film 600 and the display region 110 through a second via-hole 802 penetrating the second insulation layer.

In some embodiments, when the VDD signal line 701 and the VSS signal line 702 are arranged on a same layer, the first insulation layer and the second insulation layer are a same insulation layer, and the first via-hole 801 and the second via-hole 802 are via-holes at different positions of the insulation layer.

In some embodiments, the display signal line may further include a VGH signal line and a VGL signal line, which may be further used as the power supply line.

In some embodiments, when the VGH signal line is further used as the power supply line, a third insulation layer is provided between the shielding electrode layer and the VGH signal line, and the shielding electrode layer is connected to the VGH signal line through a third via-hole penetrating the third insulation layer.

In some embodiments, when the VGL signal line is further used as the power supply line, a fourth insulation layer is provided between the shielding electrode layer and the VGL signal line, and the shielding electrode layer is connected to the VGL signal line through a fourth via-hole penetrating the fourth insulation layer.

In some embodiments, when the VGH signal line and the VGL signal line are arranged on a same layer, the third insulation layer and the fourth insulation layer are a same insulation layer, and the third via-hole and the fourth via-hole are via-holes at different positions of the insulation layer.

In some embodiments, the first insulation layer, the second insulation layer, the third insulation layer, and/or the fourth insulation layer may be an organic layer or an inorganic layer.

Figure 5:
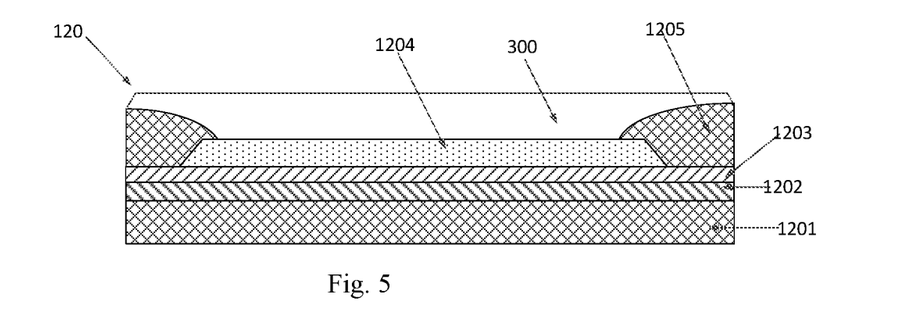
FIG. 5 is a sectional view of the display apparatus at a non-display region according to an embodiment of the present disclosure.

As shown in FIG. 5, the non-display region 120 of the flexible panel 100 includes a base substrate 1201, and a first inorganic layer 1202, a second inorganic layer 1203, a signal line layer 1204, and an organic layer 1205 which are sequentially laminated on the base substrate 1201, where the organic layer 1205 has a planarization function. The shielding electrode layer 300 is arranged on the organic layer 1205 formed as an insulation layer provided between the signal line layer 1204 and the shielding electrode layer 300. A via-hole (as shown in FIG. 5, a part of the organic layer 1205 is removed to form the via-hole) is provided at a position of the organic layer 1205 corresponding to the signal line layer 1204, and the shielding electrode layer 300 is connected to the signal line layer 1204 through the via-hole penetrating the organic layer 1205.

In some embodiments, on the flexible panel 100, the VDD signal line 701 and the VSS signal line 702 are arranged on the same layer and separated from each other, and the signal line layer 1204 is the VDD signal line 701 or the VSS signal line 702.

In some embodiments, the VGH signal line and the VGL signal line are arranged on the same layer and separated from each other, and the signal line layer 1204 is the VGH signal line or the VGL signal line.

In the display apparatus according to the above-mentioned embodiments of the present disclosure, the shielding electrode layer is arranged in the back sub-region, and covers the MUX, and the shielding electrode layer is connected to the VDD signal line, the VSS signal line, the VGH signal line, the VGL signal line or the ground line of the chip on film, so as to provide the stable voltage for the shielding electrode layer and shield the electromagnetic interference generated by the MUX.

Figure 6:
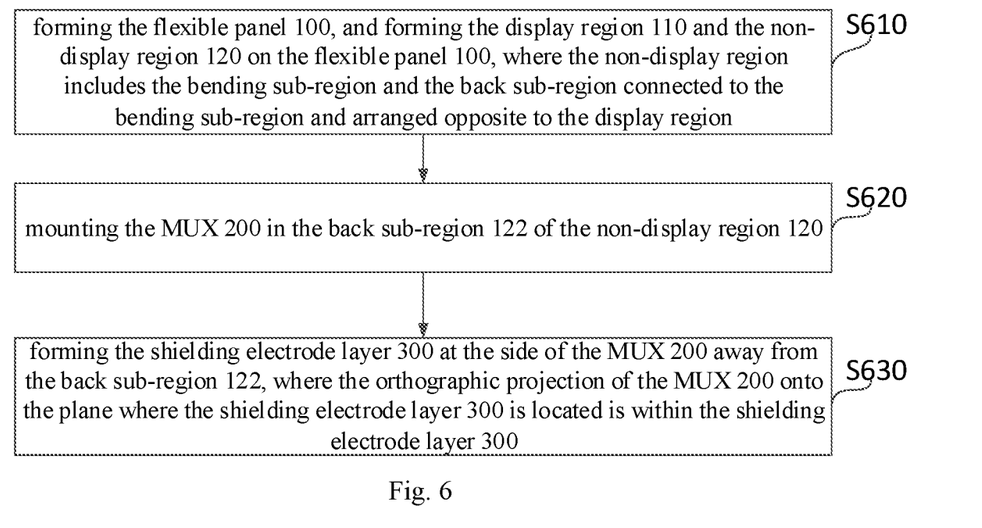
FIG. 6 is a flow chart illustrating a method for the manufacturing display apparatus according to an embodiment of the present disclosure.

The embodiments of the present disclosure further provide a method for manufacturing the above-mentioned display apparatus, as shown in FIG. 6, in conjunction with FIGS. 1 to 5, including the following steps.

Step S610, forming the flexible panel 100, and forming the display region 110 and the non-display region 120 on the flexible panel 100, where the non-display region includes the bending sub-region and the back sub-region connected to the bending sub-region and arranged opposite to the display region.

Step S620, mounting the MUX 200 in the back sub-region 122 of the non-display region 120.

Step S630, forming the shielding electrode layer 300 at the side of the MUX 200 away from the back sub-region 122, where the orthographic projection of the MUX 200 onto the plane where the shielding electrode layer 300 is located is within the shielding electrode layer 300.

In some embodiments, the non-display region 120 includes the power supply line connected to the shielding electrode layer 300.

In one implementation, when a ground line provided on the flip chip thin film 600 is further used as the power supply line for applying a stable voltage to the shielding electrode layer 300, after the shielding electrode layer 300 is formed in step S630, a connection line is arranged between the shielding electrode layer 300 and the ground line of the chip on film 600, so as to realize a connection between the shielding electrode layer 300 and the power supply line.

In some embodiments, the flexible panel includes a base substrate and an insulation layer located on the base substrate, and a plurality of display signal lines is further arranged in the back sub-region, when at least one display signal line is further used as the power supply line, the forming the shielding electrode layer on the side of the MUX away from the back sub-region includes: forming a via-hole penetrating the insulation layer at a position, corresponding to the display signal line, on the insulation layer, away from the base substrate, in the back sub-region; and depositing a conductive material on the insulation layer provided with the via-hole to form the shielding electrode layer, where the shielding electrode layer is connected to the display signal line through the via-hole.

In some embodiments, the insulation layer may be an organic layer.

In some embodiments, the display signal lines may be a VDD signal line, a VSS signal line, a VGH signal line or a VGL signal line.

In some embodiments, when the VDD signal line 701 in the non-display region 120 is further used as the power supply line for applying the stable voltage to the shielding electrode layer 300, in conjunction with FIG. 5, the forming the shielding electrode layer 300 in the back sub-region 122 in step S630 includes: forming a first via-hole 801 penetrating the organic layer 1205 at a position, corresponding to the VDD signal line 701, of the organic layer 1205, away from the base substrate 1201, in the back sub-region 122; and depositing a conductive material on the organic layer 1205 provided with the first via-hole 801 to form the shielding electrode layer 300, where the shielding electrode layer 300 is connected to the VDD signal line 701 through the first via-hole 801.

In some embodiments, when the VSS signal line 702 in the non-display region 120 is further used as the power supply line for applying the stable voltage to the shielding electrode layer 300, in connection with FIG. 5, the forming the shielding electrode layer 300 in the back sub-region 122 in step S630 includes: forming a second via-hole 802 penetrating the organic layer 1205 at a position, corresponding to the VSS signal line 702, of the organic layer 1205, away from the base substrate 1201, in the back sub-region 122; and depositing a conductive material on the organic layer 1205 provided with the second via-hole 802 to form the shielding electrode layer 300, where the shielding electrode layer 300 is connected to the VSS signal line 702 through the second via-hole 802.

It should be appreciated that, an implementation of the power supply line for applying the stable voltage to the shielding electrode layer 300 in the display apparatus and the method for manufacturing the display apparatus according to the present disclosure is merely illustrative and not limited thereto, and other implementations shall be adopted by those skilled in the art based on the principles of the embodiments of the present disclosure and are not particularly defined herein.

The above embodiments are optional embodiments of the present disclosure, it should be appreciated that those skilled in the art may make various improvements and modifications without departing from the principle of the present disclosure, and theses improvement and modifications shall fall within the protection scope of the present disclosure.

What is claimed is:

1. A display apparatus, comprising:
a flexible panel, wherein the flexible panel comprises a display region and a non-display region, the non-display region comprises a bending sub-region and a back sub-region connected to the bending sub-region and arranged opposite to the display region, and a multiplexer is arranged in the back sub-region; and
a shielding electrode layer located on a side of the multiplexer away from the back sub-region, an orthographic projection of the multiplexer onto a plane where the shielding electrode layer is located being within the shielding electrode layer;
wherein the display apparatus further comprises:
a power supply line located on the side of the multiplexer away from the back sub-region and connected to the shielding electrode layer;
wherein a plurality of display signal lines is further arranged in the back sub-region, and at least one of the plurality of display signal lines is further used as the power supply line;
wherein the at least one of the plurality of display signal lines comprises a VDD signal line and a VSS signal line, and the VDD signal line or the VSS signal line is further used as the power supply line;
wherein the display apparatus further comprises a chip on film arranged in the back sub-region;
wherein the VDD signal line comprises a first portion arranged along an edge, adjacent to the chip on film, of the display region, and a second portion between the chip on film and the display region, and used to connect the first portion to the chip on film; wherein the VSS signal line comprises a third portion surrounding edges of the display region, and a fourth portion between the chip on film and the display region and used to connect the third portion to the chip on film;
wherein a first insulation layer is provided between the shielding electrode layer and the VDD signal line, a second insulation layer is provided between the shielding electrode layer and the VSS signal line, the VDD signal line and the VSS signal line are arranged on a same layer, and the first insulation layer and the second insulation layer are a same insulation layer;
wherein in a case that the VDD signal line is further used as the power supply line, an orthographic projection of the second portion of the VDD signal line onto the back sub-region at least overlaps an orthographic projection of the shielding electrode layer onto the back sub-region, and the shielding electrode layer is connected to the second portion of the VDD signal line through a first via-hole penetrating the first insulation layer;

wherein in a case that the VSS signal line is further used as the power supply line, an orthographic projection of the fourth portion of the VSS signal line onto the back sub-region at least overlaps the orthographic projection of the shielding electrode layer onto the back sub-region, and the shielding electrode layer is connected to the fourth portion of the VSS signal line through a second via-hole penetrating the second insulation layer.

2. The display apparatus according to claim 1, further comprising a bearing structure arranged opposite to the flexible panel and an antenna unit located on the bearing structure,
wherein both the bearing structure and the antenna unit are arranged on one side of the shielding electrode layer away from the back sub-region.

3. The display apparatus according to claim 2, wherein an orthographic projection of the antenna unit onto the plane where the shielding electrode layer is located is within the shielding electrode layer.

4. The display apparatus according to claim 1, wherein the display region of the flexible panel comprises a plurality of organic light-emitting diode (OLED) display units.

5. A method for manufacturing the display apparatus according to claim 1, comprising:
forming the flexible panel, and forming the display region and the non-display region on the flexible panel, wherein the non-display region comprises the bending sub-region and the back sub-region connected to the bending sub-region and arranged opposite to the display region;
mounting the multiplexer in the back sub-region; and
forming the shielding electrode layer at the side of the multiplexer away from the back sub-region, wherein the orthographic projection of the multiplexer onto the plane where the shielding electrode layer is located is within the shielding electrode layer.

6. The method according to claim 5, wherein the flexible panel comprises a base substrate and an insulation layer on the base substrate, the plurality of display signal lines is further arranged in the back sub-region, and when at least one of the plurality of display signal lines is further used as the power supply line, the forming the shielding electrode layer on the side of the multiplexer away from the back sub-region comprises:
forming a via-hole penetrating the insulation layer at a position, corresponding to the at least one of the plurality of display signal lines, on the insulation layer, away from the base substrate, in the back sub-region; and
depositing a conductive material on the insulation layer provided with the via-hole to form the shielding electrode layer, wherein the shielding electrode layer is connected to the at least one of the plurality of display signal lines through the via-hole.

* * * * *